United States Patent
Blum et al.

(10) Patent No.: US 10,232,721 B2
(45) Date of Patent: Mar. 19, 2019

(54) DETERMINING A ZERO CURRENT OF AN ALTERNATING CURRENT

(71) Applicant: Siemens Aktiengesellschaft, Munich (DE)

(72) Inventors: Manuel Blum, Ottobrunn (DE); Thomas Komma, Ottobrunn (DE); Mirjam Mantel, Haar (DE); Monika Poebl, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 200 days.

(21) Appl. No.: 15/024,145

(22) PCT Filed: Sep. 15, 2014

(86) PCT No.: PCT/EP2014/069586
§ 371 (c)(1),
(2) Date: Mar. 23, 2016

(87) PCT Pub. No.: WO2015/043994
PCT Pub. Date: Apr. 2, 2015

(65) Prior Publication Data
US 2016/0229300 A1    Aug. 11, 2016

(30) Foreign Application Priority Data

Sep. 27, 2013 (DE) .................. 10 2013 219 530

(51) Int. Cl.
*H02J 7/00* (2006.01)
*B60L 11/18* (2006.01)
(Continued)

(52) U.S. Cl.
CPC ......... *B60L 11/182* (2013.01); *B60L 11/1811* (2013.01); *B60L 11/1848* (2013.01); *B60L 53/12* (2019.02); *B60L 53/20* (2019.02); *B60L 53/665* (2019.02); *G01R 19/175* (2013.01); *H02M 7/48* (2013.01); *H02J 7/345* (2013.01); *H02M 2001/009* (2013.01); *H02M 2007/4815* (2013.01); *Y02B 70/1441* (2013.01)

(58) Field of Classification Search
USPC ........................... 320/107, 108, 109
See application file for complete search history.

(56) References Cited

U.S. PATENT DOCUMENTS

| 2006/0250114 A1* | 11/2006 | Faberman | H02K 3/50 |
| | | | 322/24 |
| 2013/0028623 A1 | 1/2013 | Inukai | 399/69 |

FOREIGN PATENT DOCUMENTS

| CN | 202600040 U | 12/2012 | ........... G01R 19/175 |
| DE | 4328630 A1 | 2/1995 | ........... G01R 19/175 |

(Continued)

OTHER PUBLICATIONS

German Office Action, Application No. 102013219530.3, 7 pages, dated May 12, 2014.
(Continued)

*Primary Examiner* — Brian Ngo
(74) *Attorney, Agent, or Firm* — Slayden Grubert Beard PLLC

(57) ABSTRACT

A circuit arrangement for detecting a zero crossing of an alternating current is provided. The circuit arrangement includes a load through which the alternating current can flow, and an evaluation unit connected to the load and configured to evaluate an electrical voltage formed at the load, and to determining zero currents. The load comprises a capacitor through which the alternating current or a current to be measured derived therefrom can flow, and the evaluation unit is configured to account for a phase shift caused by the capacitor for determining the zero currents.

10 Claims, 4 Drawing Sheets

(51) Int. Cl.
*G01R 19/175* (2006.01)
*H02M 7/48* (2007.01)
*B60L 53/20* (2019.01)
*B60L 53/12* (2019.01)
*B60L 53/66* (2019.01)
*H02M 1/00* (2006.01)
*H02J 7/34* (2006.01)

(56) References Cited

FOREIGN PATENT DOCUMENTS

| DE | 19535271 A1 | 3/1997 | ........... G01R 19/175 |
|---|---|---|---|
| DE | 19642871 A1 | 4/1998 | ........... G01R 19/175 |
| DE | 19757573 A1 | 7/1999 | ............. G01R 19/14 |
| DE | 102008027126 A1 | 12/2009 | ........... H03K 17/082 |
| KR | 1020120016521 A | 2/2012 | ................ B60L 5/00 |
| WO | 2015/043994 A1 | 4/2015 | ........... G01R 19/175 |

OTHER PUBLICATIONS

International Search Report and Written Opinion, Application No. PCT/EP2014/069586, 19 pages, dated Jan. 27, 2015.
Hurley, W.G. et al., "Transformers and Inductors for power Electronic: Theory, Design and Applications," John Wiley & Sons ProQuest Ebook Central, XP055512486, ISBN: 978-1-119-95057-8, pp. 107-109.
European Office Action, Application No. 14771244.2, 9 pages, dated Oct. 17, 2018.

\* cited by examiner

US 10,232,721 B2

DETERMINING A ZERO CURRENT OF AN ALTERNATING CURRENT

CROSS-REFERENCE TO RELATED APPLICATIONS

This application is a U.S. National Stage Application of International Application No. PCT/EP2014/069586 filed Sep. 15, 2014, which designates the United States of America, and claims priority to DE Application No. 10 2013 219 530.3 filed Sep. 27, 2013, the contents of which are hereby incorporated by reference in their entirety.

TECHNICAL FIELD

The present invention relates to a circuit arrangement for identifying a zero-current of an alternating current, with a load through which the alternating current can flow, and an evaluation unit which is connected to the load in order to evaluate an electric voltage generated on the load through which the alternating current flows, and for the identification of zero-currents. The invention also relates to an inverter with an intermediate circuit capacitor, with at least one electronic half-bridge module connected to the intermediate circuit capacitor, and constituting a terminal for the connection of a coil for the generation of an alternating magnetic field, with a clock-pulse generator for the control of the half-bridge module and with a circuit arrangement for identifying a zero-current of an alternating current. The invention also relates to a charging station for an electrically-powered vehicle, with a terminal for an electric energy source and a charging unit for a wireless power coupling of the electrically-powered vehicle by means of an alternating magnetic field. Finally, the invention also relates to a method for identifying a zero-current of an alternating current, wherein an electric voltage generated on a load through which the alternating current flows is evaluated by means of an evaluation unit, and zero-currents are identified.

BACKGROUND

Circuit arrangements of this generic type are known in principle, and are frequently used in converters of any type, specifically inverters, in order to permit the operation of the converter or inverter for its intended purpose. To this end, it is in fact necessary to identify current characteristics, specifically for output currents of the converter or inverter. A key parameter is the identification of a zero-current in the output current of the converter or inverter.

Inverters of this generic type and methods for the operation thereof are also known in principle, for example from DE 10 2008 027 126 A1. Inverters are a form of energy converter, by means of which a d.c. voltage can be converted into an alternating voltage, specifically a single-phase or a three-phase alternating voltage. Inverters are now used in the form of "static" energy converters, meaning that, unlike dynamic energy converters, they feature no mechanical moving components, specifically rotating components, for the purposes of energy conversion. Inverters of this generic type in the form of static energy converters are generally configured as switched-mode electronic energy converters and, to this end, are provided with at least one half-bridge module, by means of which a d.c. voltage delivered to an intermediate circuit capacitor on an intermediate circuit may be converted into an alternating electric voltage. To this end, the half-bridge module is provided with two series-connected semiconductor switches, which can operate in cyclic mode by means of a clock-pulse generator such that, in the required manner, the alternating voltage is delivered on a center terminal of the half-bridge module, which is constituted by an electrical interconnection point of the two semiconductor switches in the half-bridge module. A circuit topology of this type is also described as a half-bridge circuit. Accordingly, an inverter of this type is designed for "single-phase" operation.

A high-capacity variant of an inverter of this type is provided with two parallel-connected half-bridge modules, whereby the magnitude of the alternating voltage generated is essentially doubled. To this end, the half-bridge modules are controlled in a correspondingly complementary arrangement. A circuit topology of this type is also described as a full-bridge circuit.

Inverters are also used, specifically for the constitution of a three-phase alternating voltage system, wherein at least one half-bridge module is provided for each of the alternating voltage phases. A circuit topology of this type is also described as a half-bridge circuit. Naturally, the inverter may also be provided with a pair of half-bridge modules for each phase, such that the circuit topology of a full-bridge circuit is constituted for each phase.

Inverters of this generic type are frequently used in charging stations, which are used for the wireless power coupling of an electrically-powered vehicle, for the purposes of the charging of an electric energy storage device in said electrically-powered vehicle. A wireless power coupling is formed, which obviates the need for a complex mechanical connection by means of a cable. To this end, on both the charging station side and the vehicle side, coil arrangements are generally provided respectively which, during the charging process, are positioned opposite each other, and permit the formation of a power coupling by the use of an alternating magnetic field. An arrangement of this type is known, for example, from KR 10 2012 0 016 521 A.

In order to be able to generate an appropriate alternating magnetic field in the charging station, the latter, in addition to an appropriate coil for this purpose, is also provided with an inverter which is connected to the coil and which supplies a corresponding alternating current to the coil. For the reliable operation of the charging station, and specifically of the inverter, it is necessary to identify the zero-currents. To this end, DE 10 2008 027 126 A1, for example, discloses a current sensor which is connected to a circuit arrangement which permits the evaluation of current via a differentiating circuit element. The circuit disclosed therein detects the falling current ramp by means of a differentiator, and compares the latter with a tripping signal for a semiconductor switch in a half-bridge module of the inverter. In order to permit the reliable operation of this circuit, a sinusoidal current characteristic is required which, insofar as possible, is free of harmonics. Specifically, there must be no superimposed interference. In practical operation, this results in problems, in that zero-currents cannot be detected with sufficient accuracy, thereby resulting in the inadequate control of the inverter.

SUMMARY

One embodiment provides a circuit arrangement for identifying a zero-current of an alternating current, with a load through which the alternating current can flow, and an evaluation unit which is connected to the load in order to evaluate an electric voltage generated on the load through which the alternating current flows, and for the identifying of zero-currents, wherein the load comprises a capacitor through which the alternating current or a measuring current derived therefrom can flow, and that the evaluation unit is designed to take account of a phase displacement effected by the capacitor in the identification of zero-currents.

In a further embodiment, the load is provided with a current converter through which, on the primary side, an alternating current can flow and, on the secondary side, is connected to the capacitor.

In a further embodiment, the evaluation circuit is provided with an amplification unit, specifically a comparator.

In a further embodiment, the amplification unit is provided with a low-pass filter on its output side.

In a further embodiment, the evaluation unit incorporates a digital processing unit for the digitization and evaluation of the electric voltage generated on the load.

Another embodiment provides an inverter with an intermediate circuit capacitor, with at least one electronic half-bridge module connected to the intermediate circuit capacitor, and constituting a terminal for the connection of a coil for the generation of an alternating magnetic field, with a clock-pulse generator for the control of the half-bridge module and with a circuit arrangement for identifying a zero-current of an alternating current, wherein the circuit arrangement is configured as claimed in one of the preceding claims.

Another embodiment provides a charging station for an electrically-powered vehicle, with a terminal for an electric energy source and a charging unit for a wireless power coupling of the electrically-powered vehicle by means of an alternating magnetic field, wherein the charging unit is provided with an inverter as claimed in claim 6 and with a coil, for the generation of the alternating magnetic field, connected to the inverter.

Another embodiment provides a method for identifying a zero-current of an alternating current, wherein an electric voltage generated on a load through which the alternating current flows is evaluated by means of an evaluation unit, and zero-currents are identified, wherein a capacitor is employed as the load and in that, by means of the evaluation unit, a phase displacement effected by the capacitor is considered in the identification of zero-currents.

In a further embodiment, the electric voltage generated on the capacitor is digitized, and the phase displacement is digitally eliminated.

BRIEF DESCRIPTION OF THE DRAWINGS

Example embodiments of the invention are discussed in detail below with reference to the figures, in which.

DETAILED DESCRIPTION

Figure 1:
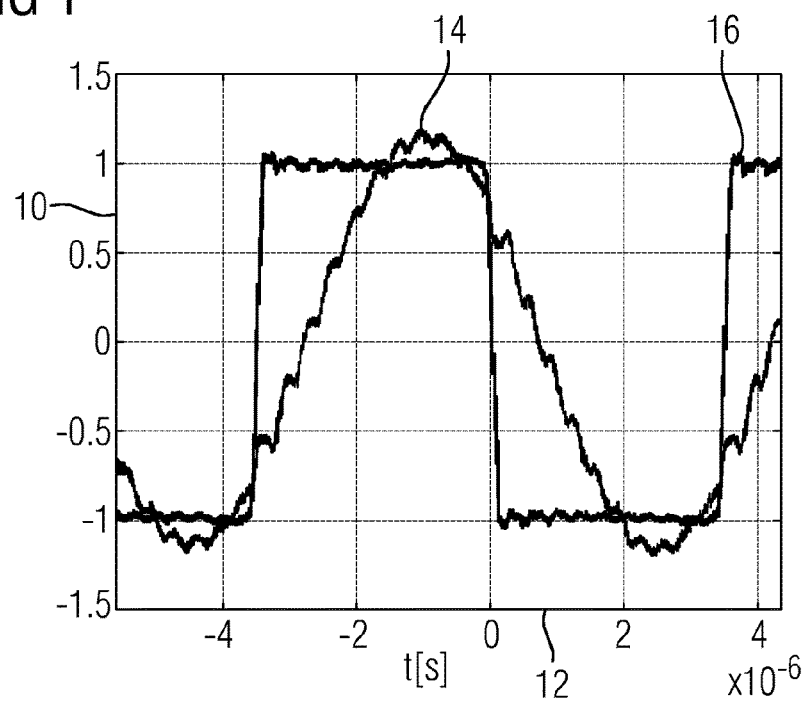
FIG. 1 shows a diagram of a schematic and standardized representation of an output voltage of an inverter, and of a coil current in a coil which is connected to the inverter.

Embodiments of the invention provide an improved control system for an inverter.

Within the context of the invention, power coupling is a coupling for the purposes of energy transmission, which makes it possible for energy to be transmitted, at least unidirectionally, from an energy source to an energy sink. The energy source may be, for example, a public electricity grid system, an electric generator, a solar cell, a fuel cell, combinations thereof and/or similar. The energy sink may be, for example, a drive of the electrically-powered vehicle, specifically an electric motor in the drive system and/or an electricity storage device for the drive system, for example an accumulator or similar. However, provision may also be made for bidirectional energy transmission, such that energy may be transmitted in both directions in an alternating arrangement. This function is fulfilled, among other elements, by the charging station, which sources energy from the energy source to which it is electrically connected, and which energy is then to be transmitted to the electrically-powered vehicle. However, provision may also be made for bidirectional energy transmission, i.e. alternating energy transmission in both directions. This function is fulfilled, among other elements, by the charging station, which sources energy from the energy source to which it is electrically connected, and which energy is then to be transmitted to the electrically-powered vehicle.

Within the context of the invention, wireless power coupling means that there is no requirement for a mechanical connection between the charging station and the electrically-powered vehicle in order to form an electrical coupling. Specifically, the formation of an electrical connection by means of a cable can be obviated. Instead, the power coupling is essentially formed by an energy field only, e.g., an alternating magnetic field.

The charging station is therefore designed for the generation of a corresponding energy field, specifically an alternating magnetic field. On the vehicle, corresponding provision is made for the capture of such an energy field or alternating magnetic field, and for the sourcing therefrom of energy for the operation of the electrically-powered vehicle in accordance with its intended purpose. Energy is converted by means of a charging device into electrical energy, which may be stored in an energy storage device on the vehicle, for the operation thereof in accordance with its intended purpose. The power coupling is therefore essentially intended for the transmission of energy, and not primarily for the transmission of information. Accordingly, means for the embodiment of the invention are designed for a correspondingly high power throughput, in comparison with a wireless communication link.

In a generic circuit arrangement, it is specifically proposed under the invention that the load should comprise a capacitor through which the alternating current or a measuring current derived therefrom can flow, and that the evaluation unit is designed to take account of a phase displacement effected by the capacitor in the identification of zero-currents. Accordingly, for the generic method, it is specifically proposed that a capacitor should be employed as the load and that, by means of the evaluation unit, a phase displacement effected by the capacitor should be considered in the identification of zero-currents.

As a load, the invention employs the capacitor which—in contrast with DE 10 2008 027 126 A1—delivers an integrating property for the alternating current such that interference, which is generally a highly frequent occurrence, can be suppressed. Simultaneously, the capacitor effects a phase displacement between the alternating current flowing therein and a resulting electric voltage generated on the capacitor, which is then eliminated during further processing by the evaluation unit.

The capacitor may be an instrument capacitor with a very limited tolerance and as small a loss factor as possible, in order to permit the accurate identification of zero-currents in the alternating current. As a result of these properties, the circuit arrangement according to the invention permits the substantially more accurate and interference-free identification of zero-currents in the alternating current. Specifically, the amplification of interference associated with the use of a differentiating component according to the prior art can be avoided. The capacitor permits the smoothing of the alternating current, with interference signals superimposed. In contrast with other conventional filter circuits based upon resistance/capacitance filtering components, the circuit arrangement according to the invention delivers a constant phase displacement between the current and the measuring voltage, essentially to a value of 90 degrees. As this voltage displacement is constant, the identification of zero-currents in the alternating current can proceed with a high degree of accuracy in consideration of this circumstance. To this end, an appropriate compensation function is provided by the evaluation unit.

According to a further aspect of the invention, the load is provided with a current converter through which, on the primary side, an alternating current can flow and, on the secondary side, is connected to the capacitor. The current converter may be configured as a conventional transformer, for the purposes of current conversion. On its secondary-side terminals, it delivers a current which corresponds to the primary-side alternating current, in accordance with the ratio of the number of turns. Accordingly, in respect of requirements for power throughput, the measuring structure can be downsized, thereby permitting the use of high-precision components. In general, components of this type are not designed for high power ratings. On its secondary side, the current converter therefore delivers the measuring current which is essentially proportional to the alternating current, and which flows through the capacitor. The resulting alternating voltage on the capacitor is then fed back—as previously—to the evaluation unit for the identification of zero-currents.

According to a further development, the evaluation circuit is provided with an amplification unit, specifically a comparator. Using the linear amplification unit, the voltage signal generated on the capacitor in response to the alternating current or the measuring current can be amplified as required, and brought up to a requisite electrical potential. For example, the amplification unit may be designed for the adjustment of the voltage signal on the capacitor to a conversion range of an analog-digital converter. A high degree of resolution in analog-digital conversion can be achieved accordingly. The amplification unit may be configured, for example, as a semiconductor amplifier based upon a transistor circuit, or as a corresponding and appropriately-connected operational amplifier. For the adjustment of potential, it may be provided that the electric voltage delivered on the capacitor is routed to the amplification unit via a coupling capacitor. In respect of its capacity, the coupling capacitor may be selected such that it does not essentially affect the evaluation process. The configuration of the amplifier as a comparator is particularly advantageous. By this arrangement, the alternating electric voltage delivered by the load can be converted directly into a digital signal, which can then be routed to a digital control system. In this case, analog-digital conversion is not required.

In a further configuration, it is proposed that the amplification unit is provided with a low-pass filter on its output side. A low-pass filter of this type permits the filtering-out of further unwanted interference signals. Evaluation by the evaluation unit is further improved accordingly.

According to a further aspect of the invention, the evaluation unit incorporates a digital processing unit for the digitization and evaluation of the electric voltage generated on the load. To this end, the digital processing unit may incorporate, for example, the above-mentioned analog-digital converter. The digital processing unit may also be provided with a computing unit, a gate array (ASIC), combinations thereof or similar, designed for the consideration of the phase displacement effected by the capacitor in the identification of zero-currents, and specifically for the elimination thereof.

Another embodiment provides a generic inverter, wherein the circuit arrangement is configured as disclosed herein. This permits the advantages associated with the circuit arrangement to be incorporated in the inverter, thereby permitting the achievement of greater operational reliability. Moreover, the employment of this circuit arrangement permits the reliable operation of the inverter, even at a high operating frequency.

Another embodiment provides a generic charging station, wherein the charging unit is provided with an inverter according to the invention and with a coil, for the generation of the alternating magnetic field, connected to the inverter. By this arrangement, the advantages associated with the inverter can also be achieved in the charging station, such that more reliable operation of the latter will also be possible.

Another embodiment provides a method whereby the electric voltage generated on the capacitor is digitized, and the phase displacement is digitally eliminated. This permits the achievement of the reliable and highly accurate identification of zero-currents. For this purpose, the evaluation unit correspondingly incorporates a computing unit, by means of which the corresponding measures can be executed. Accordingly, the computing unit is provided with a computer software product incorporating program code segments which permit the execution by the computing unit of the method according to the invention.

FIG. 1 shows a diagram of a schematic signal characteristic of an inverter output voltage 16 and of a coil current 14 on a coil which is connected to the inverter. These elements are not represented in FIG. 1. The diagram shows a time axis—the x-axis—which is identified by the reference number 12, and a signal axis—the y-axis—which is represented by the reference number 10. The time axis 12 indicates the time in µs. The y-axis 10 indicates standardized values for inverter voltage 16 and for the coil current 14. From the diagram shown in FIG. 1, it will be seen that the coil current 14 shows a temporal phase displacement in relation to the alternating voltage 16 on the inverter.

Figure 2:
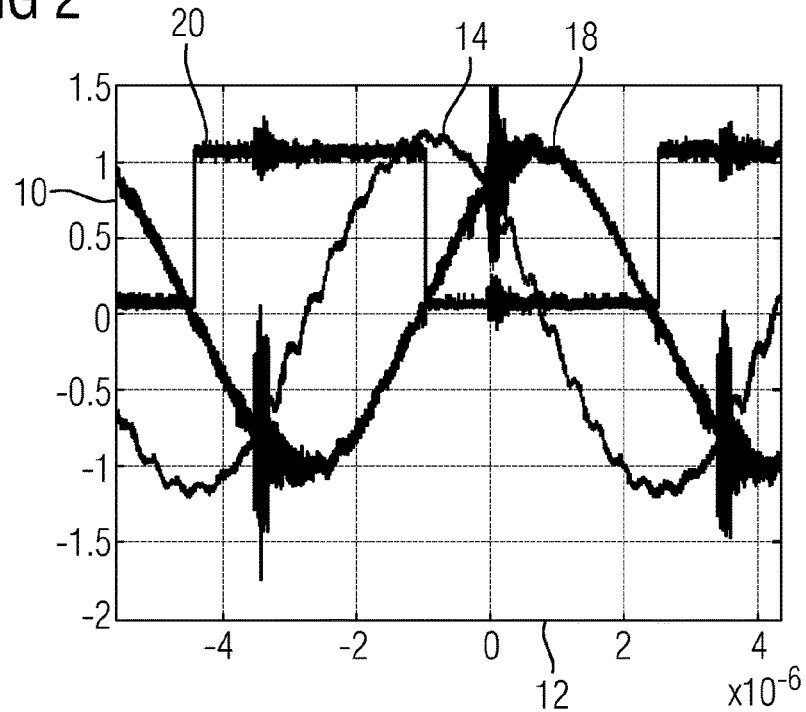
FIG. 2 shows a diagram including a schematic representation of curves, in which one curve represents the coil current in accordance with FIG. 1, a second curve represents an alternating voltage on a load according to the invention comprising a capacitor, and a third curve represents a resulting square-wave voltage.
Figure 3:
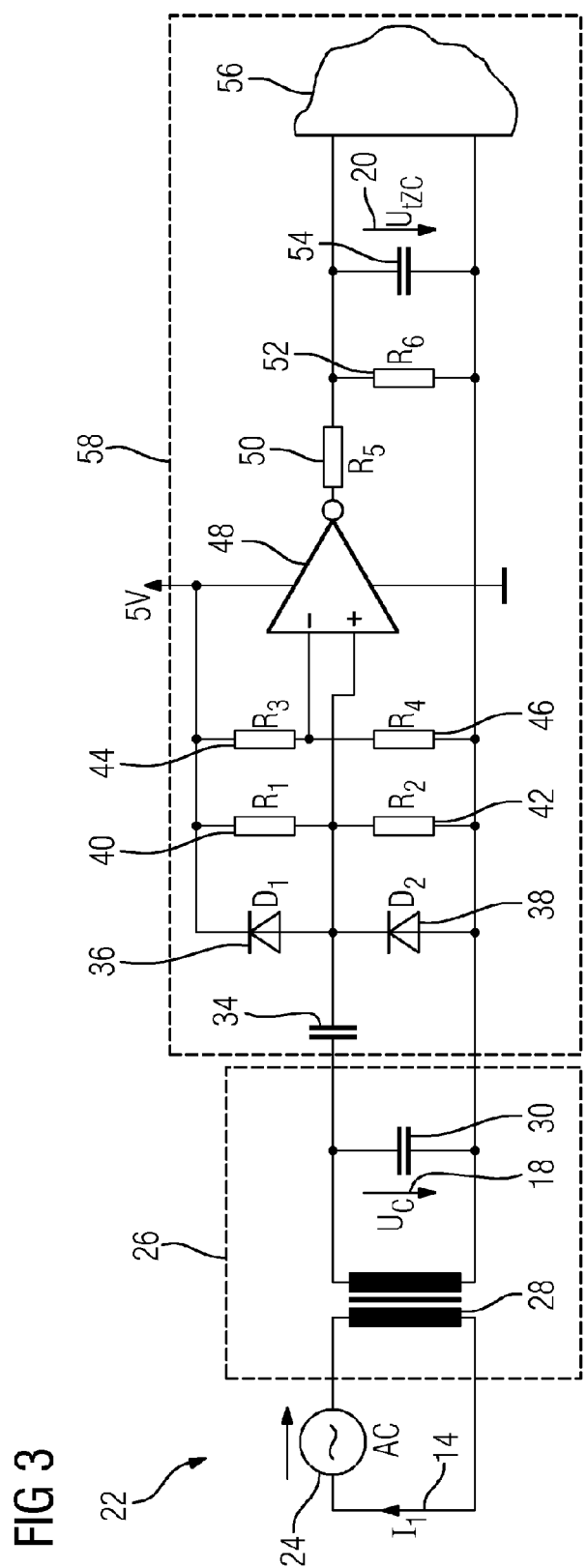
FIG. 3 shows a schematic single-line circuit diagram of a circuit arrangement according to the invention.

FIG. 2 shows a second diagram, again with the x-axis 12 as the time axis and a y-axis 10, with standardized values as per FIG. 1. In the diagram shown in FIG. 2, the coil current 14 is again represented by a curve. A second curve, with a phase displacement in relation to the curve 14, shows an alternating voltage 18 on a capacitor 30 according to the invention, which is a constituent element of a load 26 (FIG. 3). It will be seen that there is a phase displacement between the electric voltage 18 and the coil current 14 of approximately 90 degrees. It will also be seen that both the coil current 14 and the electric voltage 18 essentially show a sinusoidal profile whereby, however, interference is superimposed on the coil current 14. The electric voltage 18 is essentially unaffected by this interference. The curve 20 also represents a square-wave voltage generated by the electric voltage 18. Thereafter, this curve permits the identification of zero-currents or the phase difference between the coil current 14 and the inverter output voltage 16.

FIG. 3 shows a schematic single-line circuit diagram of a circuit arrangement 22 according to the invention. It will be seen than the circuit arrangement 22 is connected to an alternating current generator 24, which supplies the alternating current 14. In the present case, the alternating current generator is constituted by the inverter, which delivers the coil current 14.

The coil current 14 flows through a load 26 which, in turn, is connected to an evaluation unit 58. To this end, the load 26 is provided with a current converter 28 through which, on the primary side, the coil current 14 can flow. On the secondary side, the current converter 28 is connected to a capacitor 30 according to the invention, on which an electric voltage 18 is generated. The electric voltage 18 is then delivered to the evaluation unit 58 for the purposes of further signal processing, specifically for the identification of zero-currents.

To this end, the evaluation unit 58 is provided with an amplification unit 48, formed by an operational amplifier, which is connected with corresponding electronic components, namely, a coupling capacitor 34 and electrical resistances 40 to 46, in order to achieve the requisite amplification and signal formation. In the present case, it is provided that the amplification unit 48 should operate at maximum amplification, i.e. as a comparator, such that, from the essentially sinusoidal electric voltage 18, a square-wave voltage is generated as a digital signal, from which a further electric voltage 20 is constituted thereafter. This is essentially the function of the electric resistances 40 to 46. Two series-connected diodes 36, 38 are also provided, which limit the signal input connected via the coupling capacitor 34 to the positive or negative operating voltage potential of the amplification unit 48.

On the output side, the amplification unit 48 is connected to a down-circuit filter formed of electrical resistances 50, 52 and a capacitor 54 which, in the present case, executes a low-pass function and delivers the above-mentioned filtered square-wave voltage 20 as an output voltage. This is routed to a digital processing unit 56 in the evaluation unit 58 which, in the present case, is configured as a Field Programmable Gate Array (FPGA). This uses the electric voltage 20 for the identification of zero-currents or the phase displacement between the inverter output voltage 16 and the coil current 14.

Figure 4:
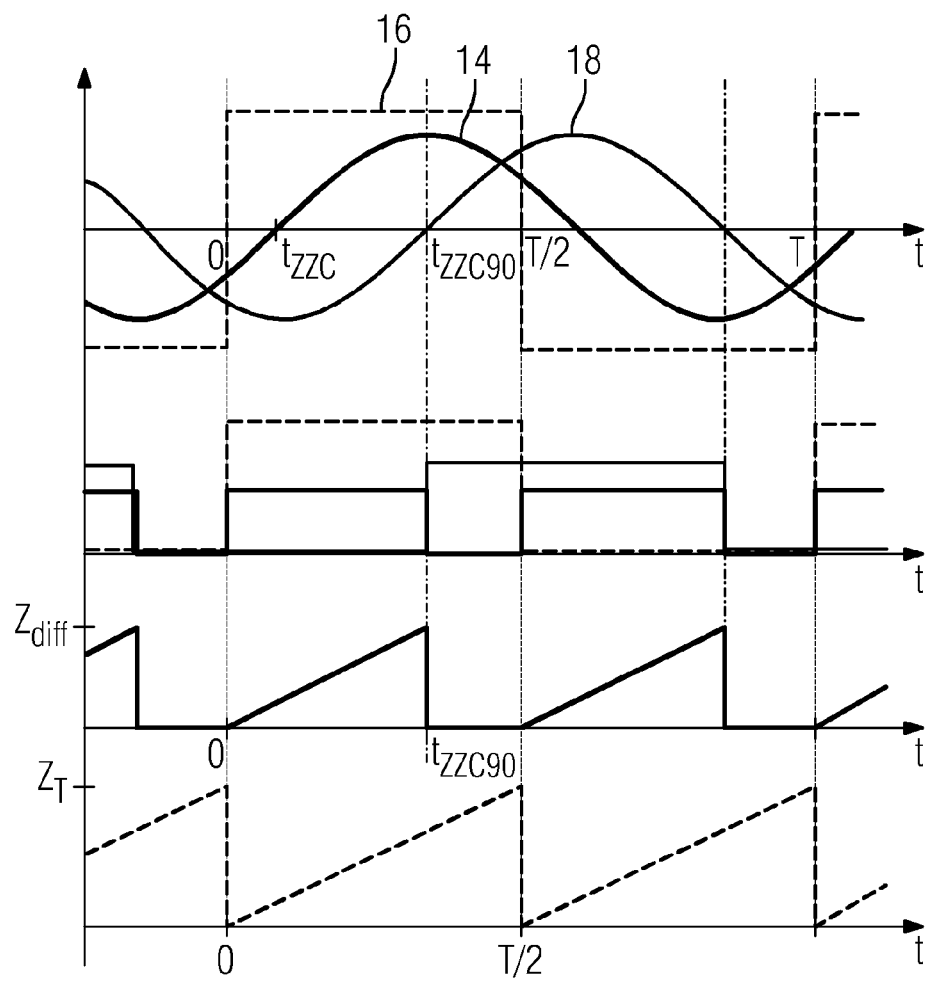
FIG. 4 shows a diagram of a series of signal-time characteristics, which represent different signal processing steps in a digital signal processing function, in accordance with a flow diagram represented in FIG. 5.
Figure 5:
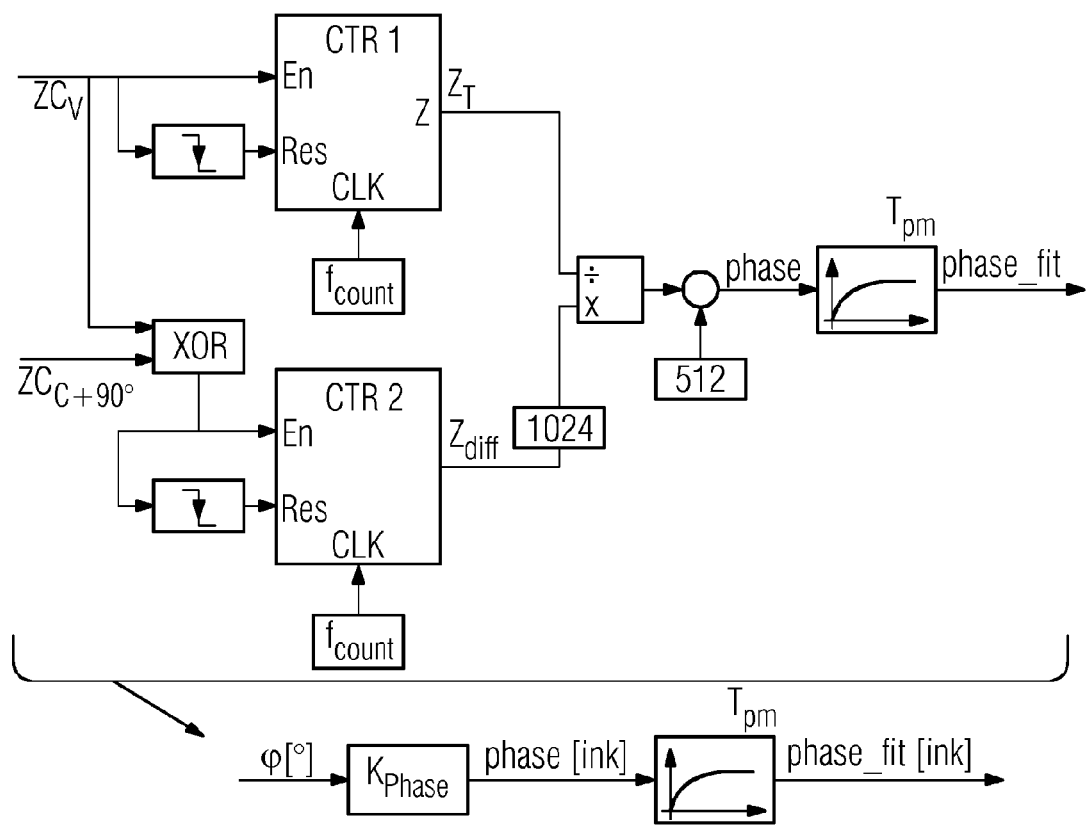
FIG. 5 shows a schematic flow diagram of a digital signal processing function according to the invention.

FIG. 5 shows a schematic view of a section of a signal flow diagram for the digital processing unit 56. FIG. 4 shows the corresponding signal characteristics associated with the flow diagram in FIG. 5.

The uppermost diagram in FIG. 4, designated as 1, represents the time characteristics of the inverter voltage 16, the coil current 14 and the electric voltage 18 on the capacitor 30.

The three subsequent diagrams in FIG. 4 show the corresponding signal-time characteristics for the signals represented in the flow diagram in FIG. 5.

It will be seen that, in the second diagram in FIG. 4, the signals derived from the corresponding zero-crossings of the electric voltages represented in 1, and their corresponding associations for the evaluation unit 58, are represented. The signals are square-wave signals. The areas under the square-wave signals represent the transit times of the inverter voltage 16 and the coil current 14, and the association of the inverter voltage 16 and the electric voltage 18 on the capacitor 30.

One option for the evaluation of these areas involves counting by means of an auxiliary clock pulse. In the third diagram in FIG. 4, a counter reading is therefore represented for the identification of the interval between a zero-crossing of the inverter voltage 16 and the zero-crossing of the coil current 14, displaced through ninety degrees. The fourth diagram in FIG. 4, i.e. the bottom diagram, shows a counter reading for the inverter output voltage 16. From this variable, it is possible to deduce the current inverter frequency and the existing phase displacement between the inverter voltage 16 and the coil current 14. From the variables tZCC90 and T/2, it is possible to identify the current phase relation, independently of the frequency. This is achieved by means of signal processing, in accordance with FIG. 5.

The exemplary embodiment represented with reference to the figures is intended for the clarification of the invention only, and is not provided by way of limitation. As required, an expert will naturally be able to infer corresponding variations, without departing from the principle of the invention.

Individual characteristics, specifically characteristics in the dependent claims, may also naturally be subject to any desired combination, in accordance with requirements. Moreover, the characteristics of devices may also naturally be indicated by corresponding process steps, and vice versa.

What is claimed is:

1. An inverter, comprising:
   an intermediate circuit capacitor,
   at least one electronic half-bridge module connected to the intermediate circuit capacitor, and including a terminal configured for connection of a coil for generating an alternating magnetic field, and
   a clock-pulse generator configured to control the half-bridge module, and
   a circuit arrangement configured to identify a zero-current of an alternating current, the circuit arrangement comprising:
   a load comprising a capacitor, wherein the alternating current or a measuring current derived from the alternating current flows through the load, and
   an evaluation unit connected to the load and configured to:
   evaluate an electric voltage generated on the load through which the alternating current flows, and
   identify zero-currents based on a phase displacement between the alternating current flowing through the capacitor and the electric voltage.

2. The inverter of claim 1, wherein the load comprises a current converter having a primary side through which an alternating current can flow, and a secondary side connected to the capacitor.

3. The inverter of claim 1, wherein the evaluation circuit comprises an amplification unit.

4. The inverter of claim 3, wherein the amplification unit comprises a low-pass filter on an output side of the amplification unit.

5. The inverter of claim 1, wherein the evaluation unit incorporates a digital processing unit for digitization and evaluation of the electric voltage generated on the load.

6. A charging station for an electrically-powered vehicle, the charging station comprising:
   a terminal for an electric energy source, and
   a charging unit for a wireless power coupling of the electrically-powered vehicle via an alternating magnetic field,
   wherein the charging unit comprises:
   an inverter comprising:
   an intermediate circuit capacitor,
   at least one electronic half-bridge module connected to the intermediate circuit capacitor, and including a terminal configured for connection of a coil for generating an alternating magnetic field, and
   a clock-pulse generator configured to control the half-bridge module, and
   a circuit arrangement configured to identify a zero-current of an alternating current, the circuit arrangement comprising:
   a load comprising a capacitor, wherein the alternating measuring current derived from the alternating current flows through the load, and
   an evaluation unit connected to the load and configured to evaluate an electric voltage generated on the load through which the alternating current flows, and identify zero-currents based on a phase displacement between the alternating current flowing through the capacitor and the electric voltage, and
   a coil connected to the inverter and configured to generate the alternating magnetic field.

7. The charging station of claim 6, wherein the load comprises a current converter having a primary side through which an alternating current can flow, and a secondary side connected to the capacitor.

8. The charging station of claim 6, wherein the evaluation circuit comprises an amplification unit.

9. The charging station of claim 6, wherein the amplification unit comprises a low-pass filter on an output side of the amplification unit.

10. The charging station of claim 6, wherein the evaluation unit incorporates a digital processing unit for digitization and evaluation of the electric voltage generated on the load.

* * * * *